United States Patent
Saji et al.

(10) Patent No.: US 9,866,265 B2
(45) Date of Patent: Jan. 9, 2018

(54) HIGH FREQUENCY CIRCUIT MODULE IN WHICH HIGH FREQUENCY CIRCUITS ARE EMBEDDED IN A MULTILAYER CIRCUIT SUBSTRATE

(71) Applicant: TAIYO YUDEN CO., LTD., Tokyo (JP)

(72) Inventors: Tetsuo Saji, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/063,754

(22) Filed: Oct. 25, 2013

(65) Prior Publication Data

US 2014/0308906 A1    Oct. 16, 2014

(30) Foreign Application Priority Data

Apr. 11, 2013 (JP) .................................. 2013-082835

(51) Int. Cl.
H04B 1/44 (2006.01)
H04B 1/48 (2006.01)
(Continued)

(52) U.S. Cl.
CPC ........... H04B 1/48 (2013.01); H01L 23/5389 (2013.01); H01L 24/19 (2013.01); H04B 1/0458 (2013.01); H04B 1/18 (2013.01); H01L 23/5384 (2013.01); H01L 23/5386 (2013.01); H01L 2224/04105 (2013.01); H01L 2224/16225 (2013.01); H01L 2224/24137 (2013.01); H01L 2224/73267 (2013.01); H01L 2924/19105 (2013.01)

(58) Field of Classification Search
CPC . H01L 2224/32225; H01L 2224/48227; H01L 2224/73265; H01L 23/66; H01L 24/32; H01L 2924/14; H01L 23/49822; H05K 3/429; H05K 2201/0715; H05K 1/0237; H05K 1/0222; H05K 1/0298; H05K 1/182
See application file for complete search history.

(56) References Cited

U.S. PATENT DOCUMENTS

2006/0103485 A1* 5/2006 Okuyama et al. ............ 333/132
2007/0123175 A1  5/2007 Watanabe et al.
(Continued)

FOREIGN PATENT DOCUMENTS

JP  2002-344146 A  11/2002
JP  2006-203652 A   8/2006
(Continued)

OTHER PUBLICATIONS

Japanese Office Action dated Aug. 20, 2014, in a counterpart Japanese patent application No. 2013-082835.

*Primary Examiner* — Golam Sorowar
(74) *Attorney, Agent, or Firm* — Chen Yoshimura LLP

(57) ABSTRACT

A high frequency circuit module is provided with: a multilayer circuit substrate; a first high frequency switch that switches connection of an antenna; a transmission filter; and reception filters. Either the transmission filter or the reception filters, or both, and the first high frequency switch are embedded in the multilayer circuit substrate, and ground conductors are formed in a conductive layer facing embedded electronic components.

12 Claims, 9 Drawing Sheets

(51) Int. Cl.
    *H04B 1/04*     (2006.01)
    *H04B 1/18*     (2006.01)
    *H01L 23/00*     (2006.01)
    *H01L 23/538*     (2006.01)

(56) References Cited

U.S. PATENT DOCUMENTS

| | | | |
|---|---|---|---|
| 2007/0182512 A1* | 8/2007 | Lee et al. | 333/246 |
| 2008/0273314 A1* | 11/2008 | Cho | H01L 21/568 |
| | | | 361/764 |
| 2011/0109401 A1 | 5/2011 | Uejima | |
| 2011/0181342 A1 | 7/2011 | Uejima et al. | |
| 2013/0250536 A1* | 9/2013 | Satake | H03F 3/245 |
| | | | 361/783 |

FOREIGN PATENT DOCUMENTS

| | | |
|---|---|---|
| JP | 2008-010995 A | 1/2008 |
| JP | 4337944 B2 | 9/2009 |
| JP | 2010-161801 A | 7/2010 |
| JP | 2011-103597 A | 5/2011 |
| WO | 2010/024376 A1 | 3/2010 |

\* cited by examiner

HIGH FREQUENCY CIRCUIT MODULE IN WHICH HIGH FREQUENCY CIRCUITS ARE EMBEDDED IN A MULTILAYER CIRCUIT SUBSTRATE

This application claims the benefit of Japanese Application No. 2013-082835, filed in Japan on Apr. 11, 2013, which is hereby incorporated by reference in its entirety.

BACKGROUND OF THE INVENTION

Field of the Invention

The present invention relates to a high frequency circuit module in which high frequency circuits are mounted on a multilayer circuit substrate, and particularly relates to a mounting structure of a high frequency switch and filters.

Description of Related Art

Conventionally, switching circuits utilizing PIN diodes have been employed in circuit modules including high frequency switches used for mobile phones. However, with a recent trend of handling multiple bands and higher communication frequency bands, high frequency switches utilizing FET switches have been more widely used. Known examples of circuit modules with these types of high frequency switches include the circuit modules disclosed in Patent Documents 1 to 3. A high frequency switching module in which a high frequency switch IC and surface acoustic wave (SAW) filter are mounted on the surface of a multilayer circuit substrate is disclosed in Patent Documents 1 and 2. A high frequency module in which a high frequency switch is embedded in a multilayer circuit substrate is disclosed in Patent Document 3.

RELATED ART DOCUMENTS

Patent Documents

Patent Document 1: Japanese Patent Application Laid-Open Publication No. 2011-1035597
Patent Document 2: WO 2010/024376
Patent Document 3: Japanese Patent No. 4337944

SUMMARY OF THE INVENTION

Recently, in these types of high frequency circuit modules, demands for further size reduction and thickness reduction are increasing. However, with conventional configurations of high frequency circuit modules, due to a problem of characteristic degradation caused by interference between signal lines or a stray capacitance between a signal line and a ground pattern, there were limits to further size reduction and reduction in thickness. To address this issue, development of a configuration in which a high frequency switch and filter are embedded in a circuit substrate has been underway. However, the technologies disclosed in Patent Documents 1 to 3 each has a structure contingent on a high frequency switch and filter being mounted on a surface of a circuit substrate, and thus merely embedding a high frequency switch or filter in these circuit substrates makes it difficult to solve problems of characteristic degradation (stray capacitance occurring in the high frequency switch and the periphery thereof, in particular), or to achieve a size and thickness reduction. In other words, for embedding a high frequency switch in a circuit substrate to achieve size reduction and thickness reduction, a specific design concept suitable for the structure is necessary.

The present invention was made in view of the above situations, and an object thereof is to provide a high frequency circuit module that has excellent high frequency characteristics and that can achieve size reduction with ease.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a high frequency circuit module of the present invention includes: a multilayer circuit substrate formed by alternately stacked insulating layers and conductive layers; a transmission filter that performs filtering on high frequency transmission signals; a reception filter that performs filtering high frequency reception signals; and a first high frequency switch that switches connections of an antenna and the transmission and reception filter, wherein either one or both of the transmission filter and reception filter, and the first high frequency switch, are embedded in the multilayer circuit substrate, and wherein a first ground conductor is formed in a first conductive layer located above the first high frequency switch and each embedded filter in the multilayer circuit substrate, the first ground conductor being formed in regions facing at least the first high frequency switch and each embedded filter, and wherein a second ground conductor is formed in a second conductive layer located below the first high frequency switch and each embedded filter in the multilayer circuit substrate, the second ground conductor being formed in regions facing at least the first high frequency switch and each embedded filter.

With the present invention, a reduction in size of the high frequency circuit module can be achieved because the first high frequency switch, and one or both of the transmission filter and reception filter is embedded in the multilayer circuit substrate. A ground conductor is formed in the first conductive layer and second conductive layer so as to sandwich the first high frequency circuit and embedded filter, resulting in a high shielding effect and excellent high frequency characteristics.

In one example of a preferred aspect of the present invention, signal wires are formed in a third conductive layer adjacent to the first conductive layer through an insulating layer, the signal wires connecting with the first high frequency switch and each embedded filter, and the first ground conductor is formed in regions facing at least the signal wires. With the present invention, current loop is minimized due to the return current of the current flowing through the first high frequency switch and embedded filter flowing to the first ground conductor. This makes it so waveform disturbance and radiation noise can be greatly suppressed.

In another example of a preferred aspect of the present invention, a first matching circuit between the antenna and first high frequency switch is mounted on a top surface of the multilayer circuit substrate, and terminal electrodes of the high frequency circuit module are formed on a bottom surface that is opposite to the top surface, and input/output terminals of the first high frequency switch are formed on the top surface of the multilayer circuit substrate. According to the present invention, even when desired characteristics cannot be obtained due to variations in the first high frequency switch, a mounting state of the first high frequency switch, or the like, because the matching circuit is mounted on the multilayer circuit substrate, it is possible to obtain desired characteristics with ease by replacement, adjustment, or the like of the matching circuit. Also, because the distance between the matching circuit and the first high frequency switch can be made shorter, a loss in high frequency signals can be reduced.

In another example of a preferred aspect of the present invention, at least the reception filter is embedded in the multilayer circuit substrate, and the reception filter and a second matching circuit that matches with a high frequency IC are mounted on a top surface of the multilayer circuit substrate, the high frequency IC processing the reception signals, and terminal electrodes of the high frequency circuit module are formed on a bottom surface that is opposite to the top surface, and input/output terminals of the embedded reception filter are formed on the top surface of the multilayer circuit substrate. According to the present invention, even when desired characteristics cannot be obtained due to variations in the embedded reception filter, a mounting state of the transmission filter, or the like, because the matching circuit is mounted on the multilayer circuit substrate, it is possible to obtain desired characteristics with ease by replacement, adjustment, or the like of the matching circuit. Also, because the distance between the matching circuit and the reception filter can be made shorter, a loss in high frequency signals can be reduced.

In another example of a preferred aspect of the present invention, the high frequency circuit module further includes: a high frequency IC that processes the reception signals filtered by each reception filter of a plurality of reception filters, the reception filters having mutually different frequency bands and being embedded in at least the multilayer circuit substrate; and a second high frequency switch that switches the reception filters connected to a common reception terminal of the high frequency IC, and the second high frequency switch is embedded in the multilayer circuit substrate and formed in a location in which signal wires that connect the second high frequency switch and the reception filters face the first ground conductor in the multilayer circuit substrate. According to the present invention, a reduction in size can be achieved because reception signals of a plurality of frequency bands are processed by a common reception circuit of the high frequency IC. With the present invention, current loop is minimized due to the return current of the current flowing through the second high frequency switch flowing to the first ground conductor. This makes it so waveform disturbance and radiation noise can be greatly suppressed.

In another example of a preferred aspect of the present invention, the high frequency circuit module further includes: a plurality of the transmission filters having mutually different frequency bands that are embedded in at least the multilayer circuit substrate; an amplifier that amplifies the transmission signals; and a third high frequency switch that switches the transmission filters connecting to output terminals from the amplifier, and the third high frequency switch is embedded in the multilayer circuit substrate, and signal wires that connect the third high frequency switch and the transmission filters are provided in the multilayer circuit substrate. According to the present invention, a reduction in size can be achieved because the transmission signal of the plurality of frequency bands can be amplified with the common amplifier. Radiation noise can be suppressed due to the length of the signal wire transmitting the amplified transmission signal being able to be shortened, and due to shielding effect being able to be made higher because of the first ground conductor and second ground conductor.

In another example of a preferred aspect of the present invention, the reception filters for the frequency bands corresponding to the embedded transmission filters are mounted on the top surface of the multilayer circuit substrate, and part or all of a region of the reception filters projected in the thickness direction of the multilayer circuit substrate overlaps the transmission filters. According to the present invention, favorable high frequency characteristics can be obtained because the distance between the third high frequency switch and the transmission filter and reception filter can be made short.

In another example of a preferred aspect of the present invention, the reception filters for the frequency bands corresponding to the embedded transmission filters, and a high frequency IC that processes the reception signals are mounted on the top surface of the multilayer circuit substrate, and signal wires that connect the high frequency IC and reception filters are mounted on the top surface of the multilayer circuit substrate. According to the present invention, transmission signal and reception signal interference can be suppressed. The present invention is particularly useful in interference prevention when a ground conductor is formed in a conductive layer between a signal wire that transmits transmission signals and a signal wire that transmits reception signals.

In another example of a preferred aspect of the present invention, the multilayer circuit substrate includes a core layer that has a greater thickness than the other conductive layers, and the first high frequency switch and each embedded filter are placed in penetrating holes or recessed parts formed in the core layer. In such a case, it is preferable to form the core layer from a conductive member and to give the core layer a ground potential in consideration of the shielding properties. A high shielding effect can also be obtained by forming the core layer from an insulating member and forming a plurality of via-conductors that connect the first ground conductor and second ground conductor around the first high frequency switch and each embedded filter. In such as case, it is preferable to place a plurality of the reception filters in one penetrating hole or recessed part, in consideration of a reduction in size.

A high frequency circuit module of the present invention as described above can achieve favorable high frequency characteristics and a reduction in size with ease.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1

Figure 1:
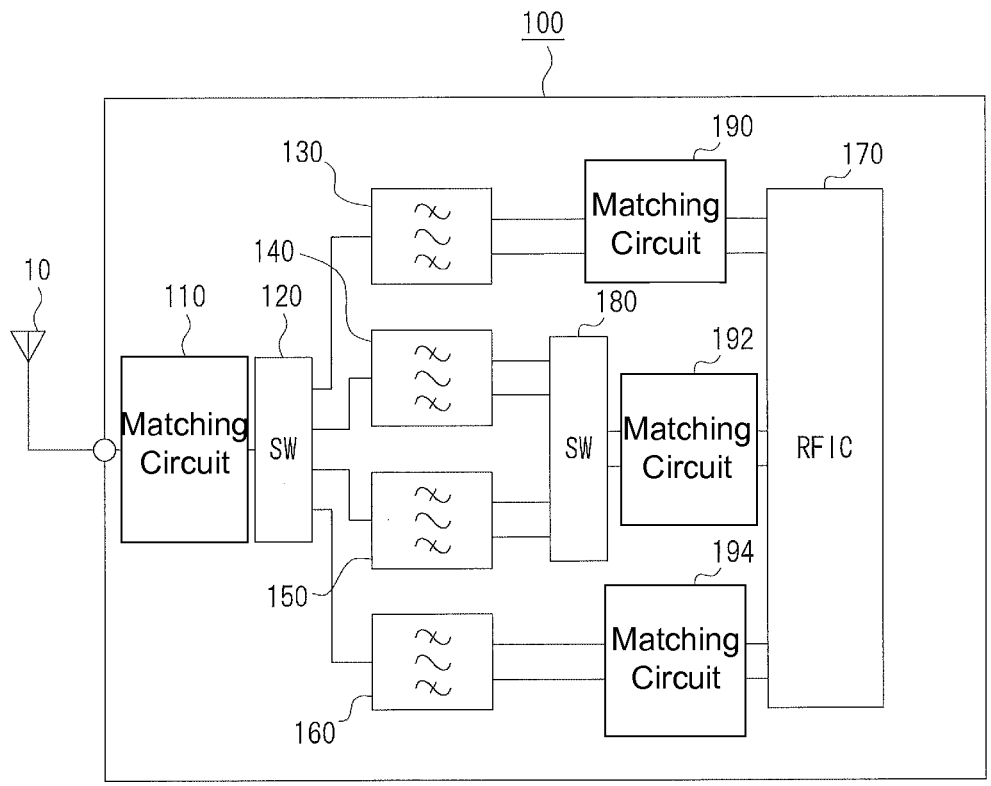
FIG. 1 is a schematic circuit diagram of a high frequency circuit module according to Embodiment 1.

A high frequency circuit module according to Embodiment 1 of the present invention will be explained with reference to figures. FIG. 1 is a schematic circuit diagram of the high frequency circuit module. In the present embodiment, for simplicity of explanation, only main configurations relating to the gist of the present invention will be explained.

A high frequency circuit module 100 of the present embodiment is used for a mobile phone that handles four frequency bands. The high frequency circuit module 100 has a diversity configuration, and includes a pair of transmission/reception circuits for one antenna, and one reception circuit (a diversity reception circuit) for another antenna. In the present embodiment, for simplicity of explanation only the latter diversity reception circuit will be explained, and an explanation of the other circuits will be omitted. A transmission filter is also included in the former transmission/reception circuits.

As shown in FIG. 1, a high frequency circuit module 100 is provided with: a matching circuit 110 that matches with an antenna 10; a first high frequency switch 120 that switches the filter to connect to the antenna 10 for each frequency band; first to fourth reception filters 130, 140, 150, and 160 that filter high frequency reception signals received by the antenna 10 in the respective frequency bands; and a RFIC (Radio Frequency Integrated Circuit) 170 that performs modulation and demodulation, frequency conversion, and the like of the high frequency signals. The high frequency circuit module 100 is also provided with a second high frequency switch 180 that switches reception signals to be inputted to the RFIC 170. The high frequency circuit module 100 is additionally provided with matching circuits 190, 192, and 194 between the first reception filter 130, fourth reception filter 160, the second high frequency switch 180, and the RFIC 170.

The first high frequency switch 120 switches the connection between the external antenna 10 and the first to fourth reception filters 130 to 160 via the matching circuit 110. The first high frequency switch 120 is a component in which a switching element such as an FET and a control element that controls the switching element are placed in one package.

The respective reception filters 130 to 160 are individual components such as elastic wave filters. Examples of the elastic wave filters include SAW (surface acoustic wave) filters and BAW (bulk acoustic wave) filters. In the present embodiment, SAW filters with balanced output are used. Balanced output terminals of the first reception filter 130 and fourth reception filter 160 are connected to the respective reception ports of the RFIC 170 via the matching circuits 190 and 194. Balanced output terminals of the second reception filter 140 and third reception filter 150 are connected to the second high frequency switch 180.

The second high frequency switch 180 makes one of the reception ports of the RFIC 170 available on a plurality of frequency bands. Selection terminals of the second high frequency switch 180 are connected to the balanced output terminals of the second reception filter 140 and third reception filter 150. The common terminal of the second high frequency switch 180 is connected to the reception port of the RFIC 170 via the matching circuit 192. The second high frequency switch 180 is a component in which a switching element such as an FET and a control element that controls the switching element are placed in one package.

As described above, the high frequency circuit module 100 of the present embodiment handles four frequency bands, and the respective reception filters 130 to 160 filter high frequency signals so as to only allow signals in a prescribed frequency band to pass through.

Specifically, the first reception filter 130 is provided for 2100 MHz W-CDMA (wideband code division multiple access) or LTE (long term evolution). That is, the first reception filter 130 is a band-pass filter for 2110 to 2170 MHz. The second reception filter 140 is provided for 900 MHz W-CDMA, LTE, or GSM (global system for mobile communications). That is, the second reception filter 140 is a band-pass filter for 925 to 960 MHz. The third reception filter 150 is provided for 850 MHz W-CDMA, LTE, or GSM. That is, the third reception filter 150 is a band-pass filter for 869 to 894 MHz. The fourth reception filter 160 is provided for 1900 MHz W-CDMA, LTE, or GSM. That is, the fourth reception filter 160 is a band-pass filter for 1930 to 1990 MHZ.

Figure 2:
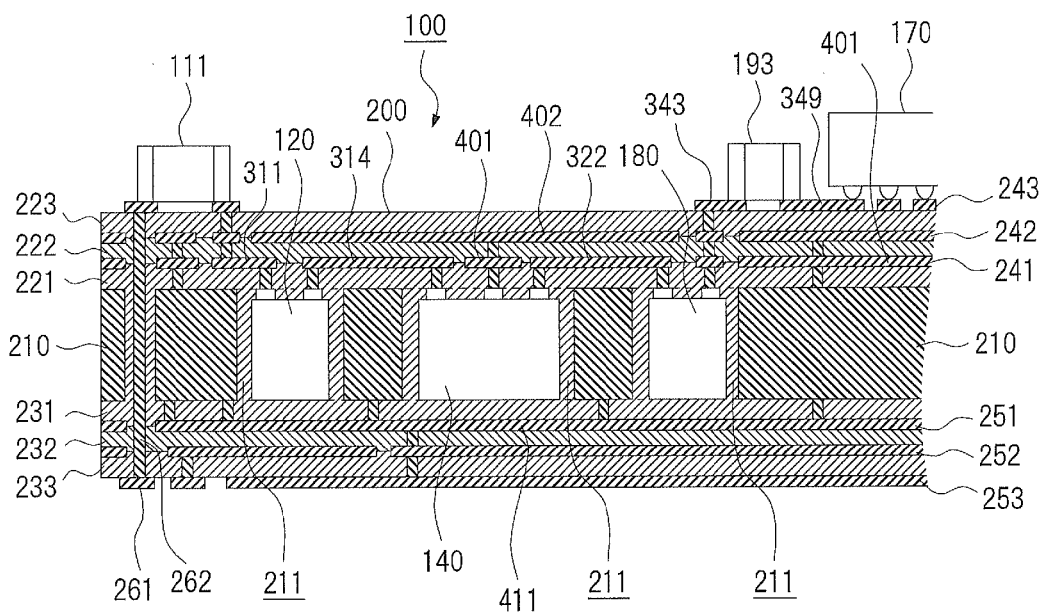
FIG. 2 is a cross-sectional view of the high frequency circuit module of Embodiment 1.

Next, a configuration of the high frequency circuit module 100 will be explained with reference to FIGS. 2 to 5. FIG. 2 is a cross-sectional view of the high frequency circuit module, and FIGS. 3 to 6 show patterns of respective layers of the multilayer circuit substrate, illustrating main parts of the high frequency circuit module. FIG. 2 is a cross-sectional view along the arrow A in FIG. 3.

As shown in FIG. 2, the high frequency circuit module 100 has electronic components 111, 191, 193, 195 (191 and 195 are omitted in FIG. 2) such as inductors and capacitors that form the matching circuits 110, 190, 192, and 194, and the RFIC 170 mounted on the surface of the top of a multilayer circuit substrate 200. The first high frequency switch 120, the first to fourth reception filters 130 to 160, and the second high frequency switch 180 are embedded in the multilayer circuit substrate 200.

The multilayer circuit substrate 200 is a multilayer substrate formed by alternately stacking insulating layers and conductive layers. As shown in FIG. 2, the multilayer circuit substrate 200 is provided with: a core layer 210 that is a conductive layer made of a relatively thick metal with good conductive properties; a plurality (three in the present embodiment) of insulating layers 221 to 223 and conductive layers 241 to 243 formed on one main surface (the top) of the core layer 210; and a plurality (three in the present embodiment) of insulating layers 231 to 233 and conductive layers 251 to 253 formed on the other main surface (the bottom) of the core layer 210. The insulating layers 221 to 223, and 231 to 233, and the conductive layers 241 to 243, and 251 to 253 are formed on both main surfaces of the core layer 210 by the build-up method. The conductive layers 243 and 253 correspond to respective surface layers of the multilayer circuit substrate 200. The conductive layer 243 corresponds to a part mounting surface of the high frequency circuit module 100, and a circuit pattern for transmitting high frequency signals, lands for mounting external components, inspection pads, and the like are formed therein. The conductive layer 253 corresponds to the bottom surface through which the high frequency circuit module is mounted on a main circuit substrate, and terminal electrodes, ground electrodes, and the like are formed therein. The terminal electrodes include an antenna terminal electrode 261 to be connected to the antenna, and the antenna terminal electrode 261 is connected to the matching circuit 110 mounted on the surface of the multilayer circuit substrate 200 via a through-hole 262.

The core layer 210 has penetrating holes 211 to house electronic components therein. In the penetrating holes 211, electronic components such as the first and second high frequency switches 120 and 180, and the first to fourth reception filters 130 to 160 are housed. Therefore, it is preferable that the thickness of the core layer 210 be greater than the height of the electronic components housed therein and that the core layer 210 have a great bending strength. The core layer 210 is made of an electrically conductive material, and provided with a reference potential (ground). Therefore, the core layer 210 can be regarded as one conductive layer of the multilayer circuit substrate 200. In the present embodiment, the core layer 210 is made of a metal plate, which is more specifically a metal plate made of a copper or copper alloy. Spaces around the housed components in the penetrating holes 211 are filled with an insulating material such as a resin.

Figure 5:
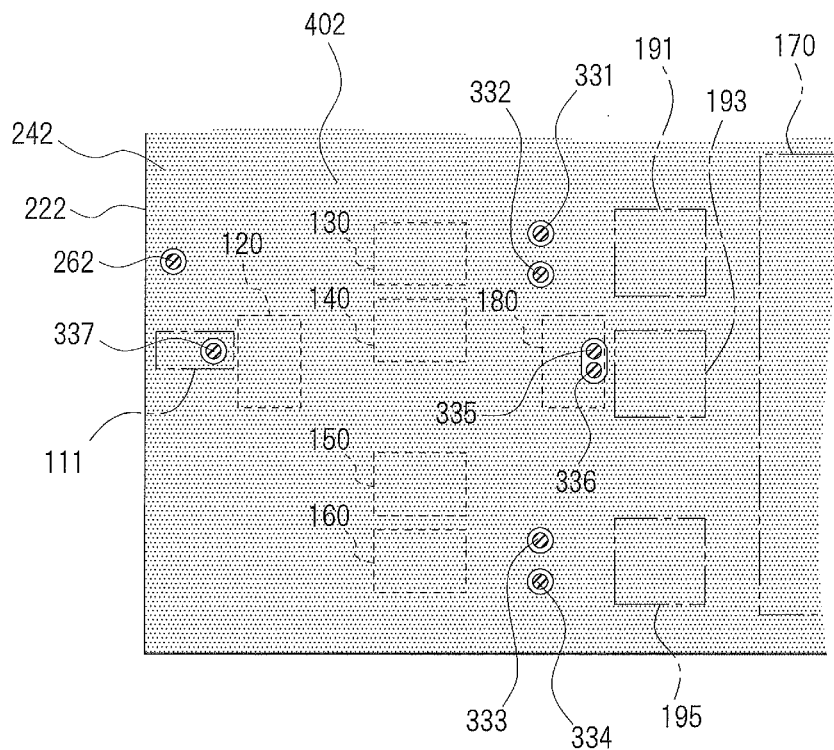
FIG. 5 shows patterns of a layer of the multilayer circuit substrate, illustrating main parts of the high frequency circuit module according to Embodiment 1.
Figure 6:
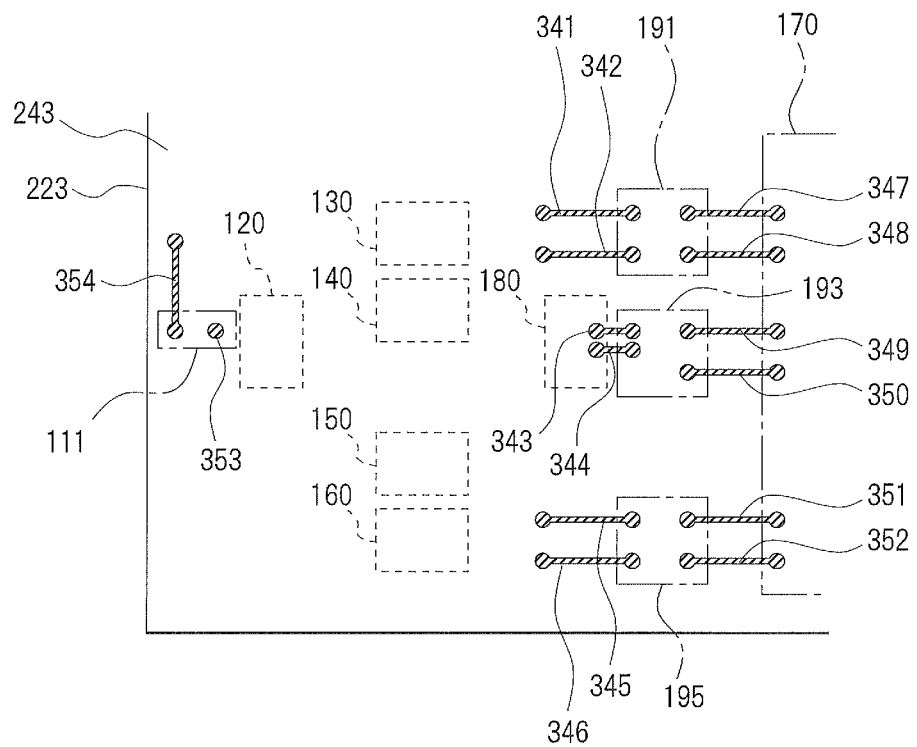
FIG. 6 shows patterns of a layer of the multilayer circuit substrate, illustrating main parts of the high frequency circuit module according to Embodiment 1.

Next, a structure for installing respective electronic components in the multilayer circuit substrate 200 will be explained. FIGS. 3 to 6, in that order, are views of the core layer 210 and the conductive layers 241 to 243 of the multilayer circuit substrate 200 from the part mounting surface side (the top of the paper of FIG. 2) of the multilayer circuit substrate 200. In FIGS. 3 to 6, the locations of the respective electronic components embedded in the multilayer circuit substrate 200 are shown by dotted lines. In FIGS. 5 and 6, the locations of the electronic components mounted on the surface layer of the multilayer circuit substrate 200 are shown by dashed lines.

Figure 3:
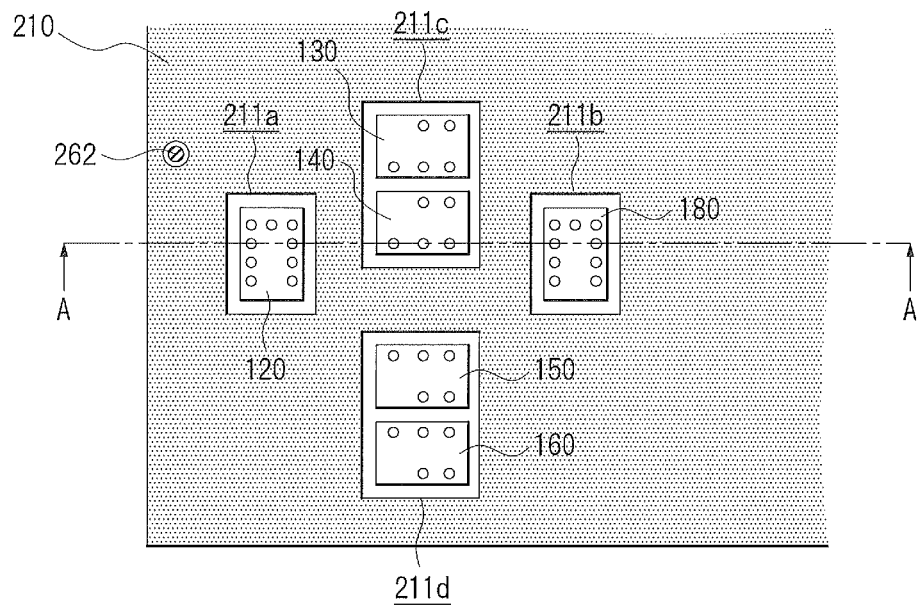
FIG. 3 shows patterns of a layer of a multilayer circuit substrate, illustrating main parts of the high frequency circuit module according to Embodiment 1.

As shown in FIG. 3, the first and second high frequency switches 120 and 180, and the first to fourth reception filters 130 to 160 are placed in the penetrating holes 211 formed in the core layer 210 of the multilayer circuit substrate 200. The first and second high frequency switches 120 and 180 are individually placed in penetrating holes 211*a* and 211*b*, respectively. The first and second reception filters 130 and 140 are placed in a common penetrating hole 211*c*. In a similar manner, the third and fourth reception filters 150 and 160 are placed in a common penetrating hole 211*d*. The respective terminals of the first and second high frequency switches 120 and 180 and the first to fourth reception filters 130 to 160 are formed on the main surface of the multilayer circuit substrate 200 opposing the part mounting surface. A through-hole 262 that is connected from the matching circuit 110 to the antenna terminal electrode 261 is formed in the core layer 210.

Figure 4:
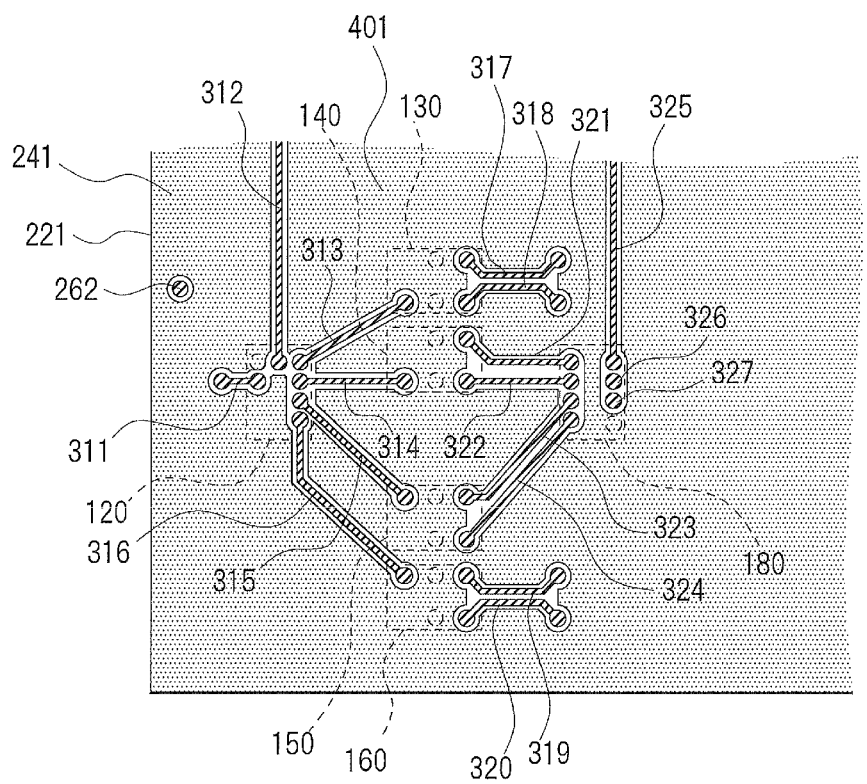
FIG. 4 shows patterns of a layer of the multilayer circuit substrate, illustrating main parts of the high frequency circuit module according to Embodiment 1.

As shown in FIG. 4, circuit patterns and lands forming signal lines that connect with the respective electronic components through corresponding via-conductors are formed in the first conductive layer 241. Specifically, formed in the first conductive layer 241 are: a circuit pattern 311 that connects with the antenna terminals, which are input/output terminals of the first high frequency switch 120; a circuit pattern 312 that connects with a power source terminal of the first high frequency switch 120; and circuit patterns 313 to 316 that connect with the circuit terminals, which are input/output terminals of the first high frequency switch 120, and that connect with unbalanced input terminals of the first to fourth reception filters 130 to 160. Circuit patterns 317 to 320 that connect the electronic components 191 and 195 forming the matching circuits 190 and 194 to the balanced output terminals of the first and fourth reception filters 130 and 160, and circuit patterns 321 to 324 that connect selection terminals of the second high frequency switch 180 to the balanced output terminals of the second and third reception filters 140 and 150, are further formed in the first conductive layer 241. A circuit pattern 325 that connects with a power source terminal of the second high frequency switch 180, lands 326 and 327 that connect with common terminals of the second high frequency switch 180, and the through-hole 262, are also formed in the first conductive layer 241. Furthermore, a so-called "ground plane" ground conductor 401 is wholly formed in the first conductive layer 241 at prescribed distances from the pattern circuits 311 to 324, the lands 326 and 327, and the through-hole 262. This ground conductor 401 connects with the core layer 210 through the via-conductors, and connects with ground terminals of the first and second high frequency switches 120 and 180, and ground terminals of the first to fourth reception filters 130 to 160 through the via-conductors. For simplicity of explanation, details have been omitted about circuit patterns that connect with control terminals of the first and second high frequency switches 120 and 180 in the present embodiment. In order to prevent common-mode noise, the ground conductor 401 is not formed between the pair of circuit patterns 317 and 318 that extend from the balanced input/output terminals of the reception filter 130. This is similar for the other reception filters 140 to 160.

As shown in FIG. 5, formed in a second conductive layer 242 are: lands 331 to 334 that connect with ends of the circuit patterns 317 to 320 formed in the first conductive layer 241 through via-conductors; lands 335 and 336 that connect with the lands 326 and 327 formed in the first conductive layer 241 through via-conductors; a land 337 that connects with an end of the circuit pattern 311 formed in the first conductive layer 241 through a via-conductor; and the through-hole 262. A so called "ground plane" ground conductor 402 is wholly formed in the second conductive layer 242 at prescribed distances from the lands 331 to 337 and the through-hole 262. This ground conductor 402 is connected with the ground conductor 401 of the first conductive layer 241 through via-conductors. A first point to note is that the ground conductor 402 is formed in the regions facing the respective embedded electronic components, except for the formation areas of the necessary circuit patterns and lands. This makes the shielding characteristic of the respective embedded electronic components high. A second point to note is that the ground conductor 402 is formed at least in the regions facing the respective circuit patterns 311 and 313 to 324 formed in the first conductive layer 241. This causes return current of the current flowing through the circuit patterns 311 and 313 to 324 to pass through locations facing the respective circuit patterns 311 and 313 to 324 in the ground conductor 402. This minimizes the current loop, so waveform disturbance and radiation noise can be greatly suppressed.

As shown in FIG. 6, formed in a third conductive layer 243, i.e., the surface layer of the multilayer circuit substrate 200, are: circuit patterns 341 to 346 that connect with terminals on the input side of the electronic components 191, 193, and 195 forming the matching circuits 190, 192, and 194; and circuit patterns 347 to 352 that connect terminals on the output side of the electronic components 191, 193, and 195 to the reception ports of the RFIC 170. Ends of the circuits 341 to 346 are connected with the lands 331 to 336 formed in the second conductive layer 242 through via-conductors. A land 353 that connects with the land 337 formed in the second conductive layer 242 through a via-conductor and that connects with one terminal of the electronic component 111 forming the matching circuit 110, and a circuit pattern 354 that connects with another terminal of the electronic component 111 and the through-hole 262, are formed in the third conductive layer 243.

As shown in FIG. 2, a so-called "ground plane" ground conductor 411 is formed in the conductive layer 251, which faces the respective embedded electronic components and is formed on the side opposite to the conductive layer 241. This ground conductor 411 is connected to the core layer 210 through via-conductors. A point to note is that this ground conductor 411 is formed in the areas facing the respective embedded electronic components, except for the formation areas of the necessary circuit patterns and lands. In this way, the respective embedded electronic components are surrounded by the ground conductor 401 formed in the conductive layer 241, the conductive core layer 210, and the ground conductor 411 formed in the conductive layer 251. Accordingly, the respective embedded electronic components have high shielding characteristics.

Next, one of the features of the present invention will be explained with regard to a relationship between the installation structure of the respective reception filters 130 to 160 shown in FIG. 3 and the circuits shown in FIG. 1. As shown in FIG. 3, two reception filters are placed in the multilayer circuit substrate 200 for each penetrating hole. One feature of the present invention is that the range of the frequency bands of the plurality of reception filters placed in one penetrating hole is separated at a value greater than or equal to a prescribed frequency. Specifically, the respective reception filters may be largely divided into a plurality (two, for example) of groups based on high and low pass frequency bands, and reception filters of different groups may be placed in one penetrating hole. The frequency bands at a prescribed frequency level (1 GHz, for example) and higher may be grouped as a higher range group, and the frequency bands lower than that may be grouped as a lower range group. As a result, the frequency bands can be separated from each other over by at least a frequency range between these groups. In the present embodiment, the reception filters are grouped with 1 GHz as the limit, and the first reception filter 130 and second reception filter 140 are placed in the penetrating hole 211c and the third reception filter 150 and fourth reception filter 160 are placed in the penetrating hole 211d.

As described above, in the high frequency circuit module 100 of the present embodiment, the first and second high frequency switches 120 and 180 and the first to fourth reception filters 130 to 160 are embedded in the multilayer circuit substrate 200, and thus it is possible to achieve the size reduction. The respective embedded electronic components are sandwiched by the ground conductors 402 and 411, so the shielding effect of the electronic components is high, with excellent high-frequency characteristics. The respective electronic components are placed in the penetrating holes 211 formed in the conductive core layer 210, or in other words are surrounded by the conductors, so a high shielding effect is achievable. The circuit patterns 313 to 316 that are signal lines connecting the first high frequency switch 120 and the first to fourth reception filters 130 to 160, and the circuit patterns 321 to 324 that are signal lines connecting the first to fourth reception filters 130 to 160 and the second high frequency switch 180, are formed in the multilayer circuit substrate 200. The ground conductor 402 is formed in the areas facing the circuit patterns 313 to 316 and 321 to 322, and thus the current flowing to the circuit patterns 313 to 316 and 321 to 322 and the current loop formed by the return current thereof can be suppressed to a minimum. This makes it possible to reduce the waveform disturbance and radiation noise.

According to the high frequency circuit module 100 of the present embodiment, the reception signals of the plurality of frequency bands can be switched by the second high frequency switch 180, and thus are able to be processed by the common reception circuit of the RFIC 170. This makes the reduction in size possible.

In the high frequency circuit module 100 of the present embodiment, the matching circuits 110, 190, 192 and 194 are mounted on the multilayer circuit substrate 200, so a desired characteristic can be obtained with ease by switching, adjusting, etc. the matching circuits. The distance between the matching circuits and the embedded electronic components can also be made short, so loss of high frequency signals can be suppressed.

Embodiment 2

A high frequency circuit module according to Embodiment 2 of the present invention will be explained with reference to figure. The high frequency circuit module of the present embodiment differs from Embodiment 1 in regards to the layered structure of the multilayer circuit substrate. Other features are the same as in Embodiment 1, and thus only the differences will be explained. Configurations that are similar to Embodiment 1 are given the same reference characters.

Figure 7:
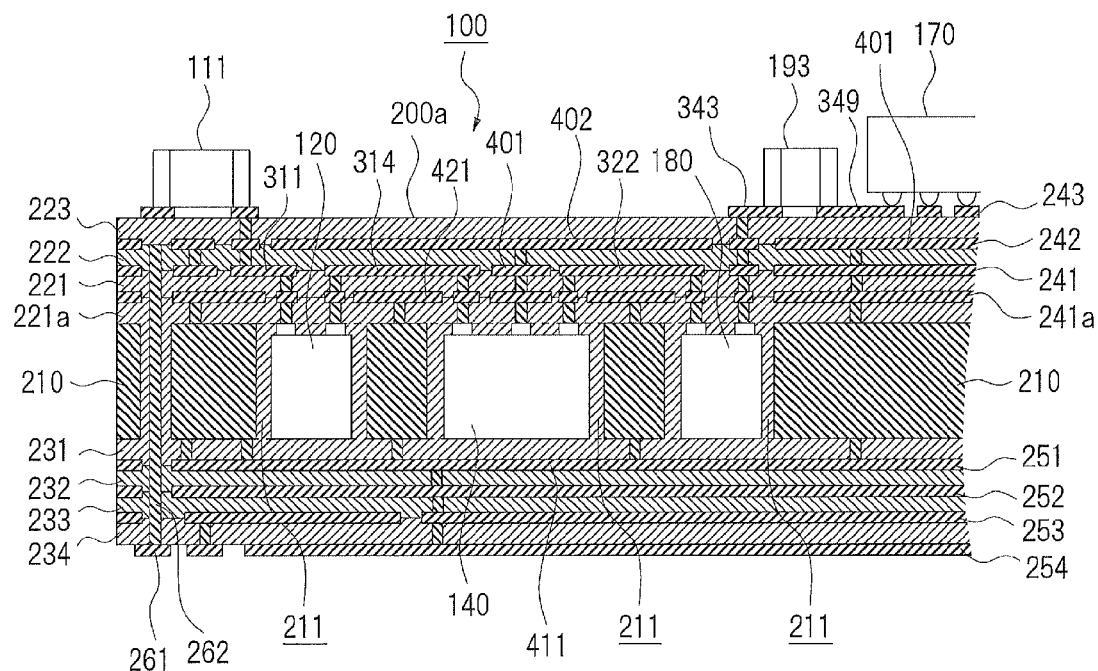
FIG. 7 is a cross-sectional view of a high frequency circuit module of Embodiment 2.

FIG. 7 is a cross-sectional view of the high frequency circuit module according to Embodiment 2. The multilayer circuit substrate 200 of Embodiment 1 had the core layer 210 at the center with three layers each of insulating layers and conductive layers on both surfaces of the core layer 210. A multilayer circuit substrate 200a of the present embodiment differs from Embodiment 1 in that a core layer 210 at the center has four layers each of insulating layers and conductive layers on both surfaces of the core layer 210. Specifically, as shown in FIG. 7, the multilayer circuit substrate 200a has insulating layers 221a and 221 to 223 and conductive layers 241a and 241 to 243 alternately layered on the top of the core layer 210. Insulating layers 231 to 234 and conductive layers 251 to 254 are alternately stacked on the bottom of the core layer 210. The configuration of the conductive layers 241 to 243 is the same as in Embodiment 1. The present embodiment has a configuration in which the conductive layer 241a is present between the first conductive layer 241 according to Embodiment 1 and the core layer 210. Lands are formed in this conductive layer 241a for connecting embedded electronic components to circuit patterns and the like formed in the first conductive layer 241 through via-conductors. A so-called "ground plane" ground conductor 421 is wholly formed in the first conductive layer 241a at prescribed distances from the lands. This ground conductor 421 is connected to the core layer 210 and the first conductive layer 241 through the via-conductors.

A first point to note is that this ground conductor 421 is formed in the areas facing the respective embedded electronic components, except for the formation areas of the necessary lands and the like. This makes the shielding characteristic of the respective embedded electronic components high. A second point to note is that the ground conductor 421 is formed at least in the regions facing the respective circuit patterns 311 and 313 to 324 formed in the first conductive layer 241. This causes return current of the current flowing through the circuit patterns 311 and 313 to 324 to pass through locations facing the respective circuit patterns 311 and 313 to 324 in the ground conductor 421. This minimizes the current loop, so waveform disturbance and radiation noise can be greatly suppressed.

According to the high frequency circuit module of the present embodiment, the shielding characteristics of the respective embedded electronic components are improved as compared to Embodiment 1. In other words, in Embodiment 1 the ground conductor 401 is formed in the first conductive layer 241 facing the core layer 210, while the circuit patterns 311 to 324 and the like were also formed in the conductive layer 241. However, in the present embodiment the circuit patterns are not formed in the conductive layer 241a facing the core layer 210, resulting in the formation area of the ground conductor 421 being able to be made larger. Other functions and effects are the same as in Embodiment 1.

Embodiment 3

Figure 8:
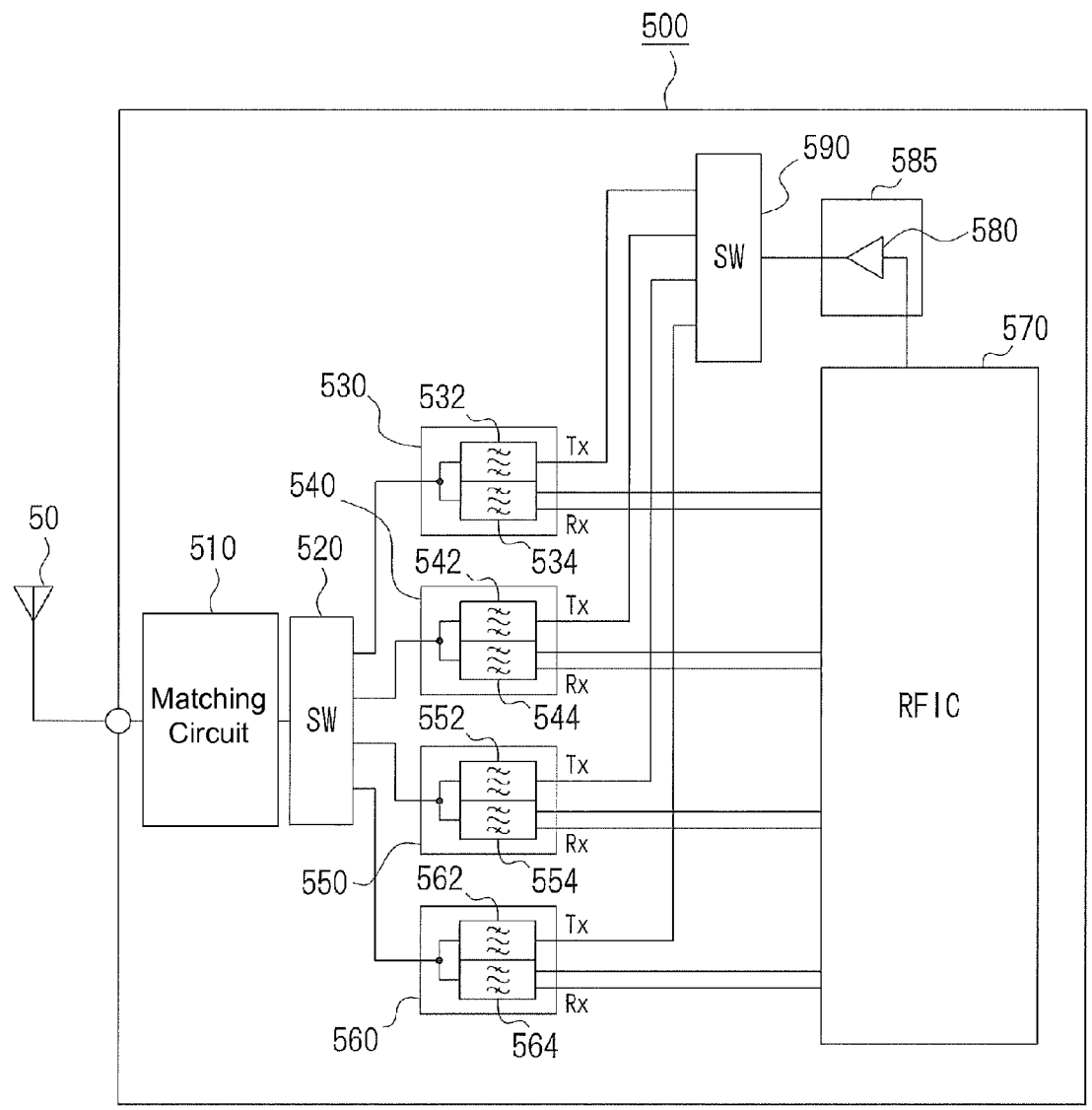
FIG. 8 is a schematic circuit diagram of a high frequency circuit module according to Embodiment 3.

A high frequency circuit module according to Embodiment 3 of the present invention will be explained with reference to figures. FIG. 8 is a schematic circuit diagram of the high frequency circuit module. In the present embodiment, for ease of explanation, only main configurations relating to the gist of the present invention will be explained.

A high frequency circuit module 500 of the present embodiment is used for a mobile phone that handles four frequency bands. This high frequency circuit module 500 has a pair of transmission/reception circuits for one antenna.

As shown in FIG. 8, the high frequency circuit module 500 is provided with: a matching circuit 510 that matches with an antenna 50; a first high frequency switch 520 that switches the connection of the antenna 50 for each frequency band; first to fourth duplexers 530, 540, 550, and 560 that electrically isolate transmission signals and reception signals in order to perform transmission and reception with the common antenna 50; a RFIC (Radio Frequency Integrated Circuit) 570 that performs modulation and demodulation and frequency conversion of high frequency signals, and the like; a high frequency power amplifier 580 that amplifies the high frequency signals outputted from the RFIC 570; and a third high frequency switch 590 that switches the destination of the transmission signals that have been amplified by the high frequency power amplifier 580. The actual circuit configurations have transmission signal band-pass filters, reception signal matching circuits, and the like for each frequency band. However, these have been omitted in the present embodiment for simplicity of explanation.

The first high frequency switch 520 switches the connection between the external antenna 50 and the first to fourth duplexers 530 to 560 via the matching circuit 510. The first high frequency switch 520 is a component in which a switching element such as an FET and a control element that controls the switching element are placed in one package.

Each duplexer 530 to 560 has a transmission filter 532, 542, 552, and 562 and a reception filter 534, 544, 554, and 564, respectively. Each transmission filter 532, 542, 552, and 562, and each reception filter 534, 544, 554, and 564 are made of a component such as an elastic wave filter. Examples of the elastic wave filters include SAW (surface acoustic wave) filters and BAW (bulk acoustic wave) filters. In the present embodiment, SAW filters with unbalanced output are used for the transmission filters 532, 542, 552, and 562, and SAW filters with balanced output are used for the reception filters 534, 544, 554, and 564. Input terminals of the transmission filters 532, 542, 552, and 562 are connected to selection terminals of the third high frequency switch 590. The balanced output terminals of the reception filters 534, 544, 554, and 564 are connected to reception ports of the RFIC 570 as necessary via the matching circuits (not shown).

The high frequency power amplifier 580 is packaged with one power amplifier IC 585. The output terminal of the high frequency power amplifier 580 is connected to a common terminal of the third high frequency switch 590, and the input terminal is connected to the transmission port of the RFIC 570. The RFIC 570 performs transmission and reception processing such as modulation and demodulation and frequency switching of high frequency signals.

The third high frequency switch 590 is provided to allow the plurality of frequency bands to undergo the same transmission processing by the RFIC 570 and the same amplifying by the high frequency power amplifier 580. The selection terminals of the third high frequency switch 590 are respectively connected to the input terminals of the transmission filters 532, 542, 552, and 562, and the common terminal is connected to the output terminal of the high frequency power amplifier 580. The third high frequency switch 590 is a component in which a switching element such as an FET and a control element that controls the switching element are placed in one package.

As described above, the high frequency circuit module 500 of the present embodiment handles four frequency bands, and the duplexers 530 to 560 filter high frequency signals so as to only allow signals in a prescribed frequency band to pass through.

Specifically, the first duplexer 530 is provided for 2100 MHz W-CDMA (wideband code division multiple access) or LTE (long term evolution). Accordingly, the first transmission filter 532 is a 1920 to 1980 MHz band-pass filter, and the first reception filter 534 is a 2110 to 2170 MHz band-pass filter.

The second duplexer 540 is provided for 900 MHz W-CDMA, LTE or GSM (global system for mobile communications). Accordingly, the second transmission filter 542 is an 880 to 915 MHz band-pass filter, and the second reception filter 544 is a 925 to 960 MHz band-pass filter.

The third duplexer 550 is provided for 1900 MHz W-CDMA, LTE, or GSM. Accordingly, the third transmission filter 552 is an 1850 to 1910 MHz band-pass filter, and the third reception filter 554 is a 1930 to 1990 MHz band-pass filter.

The fourth duplexer 560 is provided for 850 MHz W-CDMA, LTE, or GSM. Accordingly, the fourth transmission filter 562 is an 824 to 849 MHz band-pass filter, and the fourth reception filter 564 is an 869 to 894 MHz band-pass filter.

Figure 9:
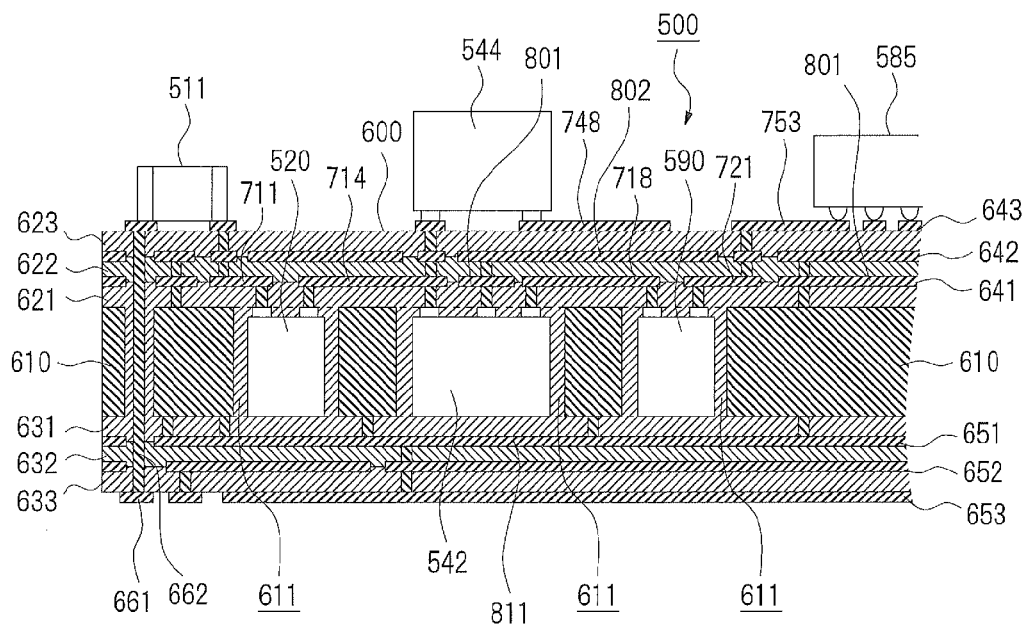
FIG. 9 is a cross-sectional view of the high frequency circuit module of Embodiment 3.

Next, a configuration of the high frequency circuit module 500 will be explained with reference to FIGS. 9 to 13. FIG. 9 is a cross-sectional view of the high frequency circuit module, and FIGS. 10 to 13 show patterns of respective layers of the multilayer circuit substrate, illustrating main parts of the high frequency circuit module. FIG. 9 is a cross-sectional view along the arrow A in FIG. 10.

As shown in FIG. 9, mounted on the surface of the top of the multilayer circuit substrate 600 of the high frequency circuit module 500 are an electronic component 511 such as an inductor or a capacitor that forms the matching circuit 510, the first to fourth reception filters 534, 544, 554, and 564 that form the respective duplexers 530 to 560, the power amplifier IC 585, and the RFIC 570. Meanwhile, the first high frequency switch 520, the first to fourth transmission filters 532, 542, 552, and 562 that form the respective duplexers 530 to 560, and the third high frequency switch 590 are embedded in a multilayer circuit substrate 600. The first transmission filter 532 is embedded in a location overlapping part or all of a region in which the corresponding first reception filter 534 is projected in the thickness direction of the multilayer circuit substrate 600. This is similar for the other transmission filters 542, 552, and 562.

The multilayer circuit substrate 600 is a multilayer substrate formed by alternately stacking insulating layers and conductive layers. As shown in FIG. 9, the multilayer circuit substrate 600 is provided with: a core layer 610 that is a conductive layer made of a relatively thick metal with good conductive properties; a plurality (three in the present embodiment) of insulating layers 621 to 623 and conductive layers 641 to 643 formed on one main surface (the top) of the core layer 610; and a plurality (three in the present embodiment) of insulating layers 631 to 633 and conductive layers 651 to 653 formed on the other main surface (the bottom) of the core layer 610. The insulating layers 621 to 623, and 631 to 633, and the conductive layers 641 to 643, and 651 to 653 are formed on both main surfaces of the core layer 610 by the build-up method. The conductive layers 643 and 653 correspond to respective surface layers of the multilayer circuit substrate 600. The conductive layer 643 corresponds to a part mounting surface of the high frequency circuit module 600, and a circuit pattern for transmitting high frequency signals, lands for mounting external components, inspection pads, and the like are formed therein. The conductive layer 653 corresponds to the bottom surface through which the high frequency circuit module is mounted on a main circuit substrate, and terminal electrodes, ground electrodes, and the like are formed therein. The terminal electrodes include an antenna terminal electrode 661 to be connected to the antenna, and the antenna terminal electrode 661 is connected to the matching circuit 510 mounted on the upper surface of the multilayer circuit substrate 600 via a through-hole 662.

The core layer 610 has penetrating holes 611 to house electronic components therein. Electronic components such as the first and third high frequency switches 520 and 590 and the first to fourth transmission filters 532, 542, 552, and 562 are placed in the penetrating holes 611. Therefore, it is preferable that the thickness of the core layer 610 be greater than the height of the electronic components housed therein and that the core layer 610 have a great bending strength. The core layer 610 is made of an electrically conductive material, and provided with a reference potential (ground). Therefore, the core layer 610 can be regarded as one conductive layer of the multilayer circuit substrate 600. In the present embodiment, the core layer 610 is made of a metal plate, which is more specifically a metal plate made of a copper or copper alloy. Spaces around the housed components in the penetrating holes 611 are filled with an insulating material such as a resin.

Figure 12:
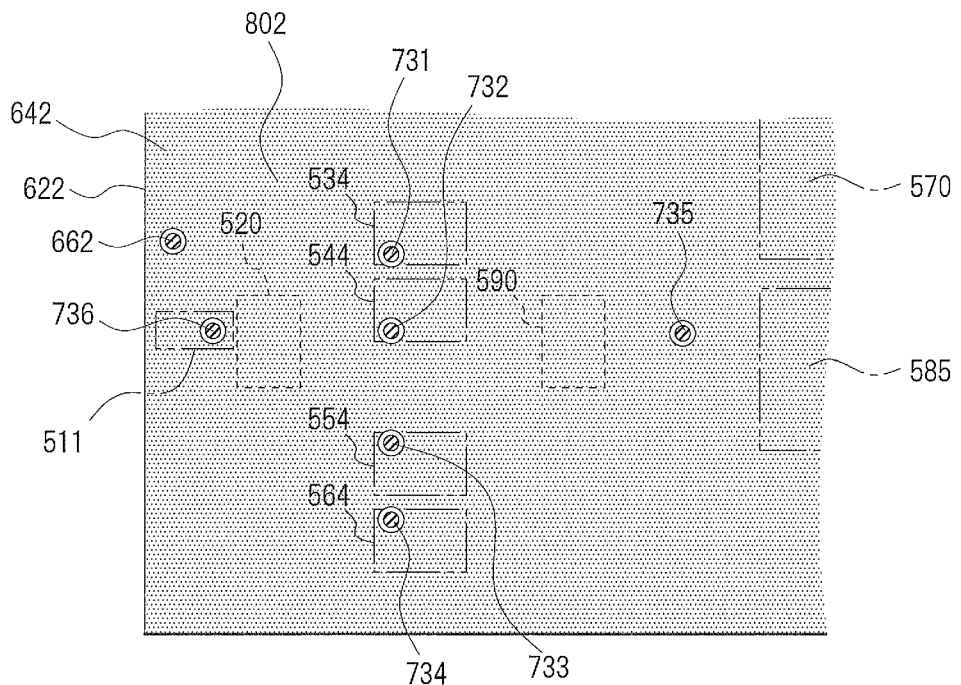
FIG. 12 shows patterns of a layer of the multilayer circuit substrate, illustrating main parts of the high frequency circuit module according to Embodiment 3.
Figure 13:
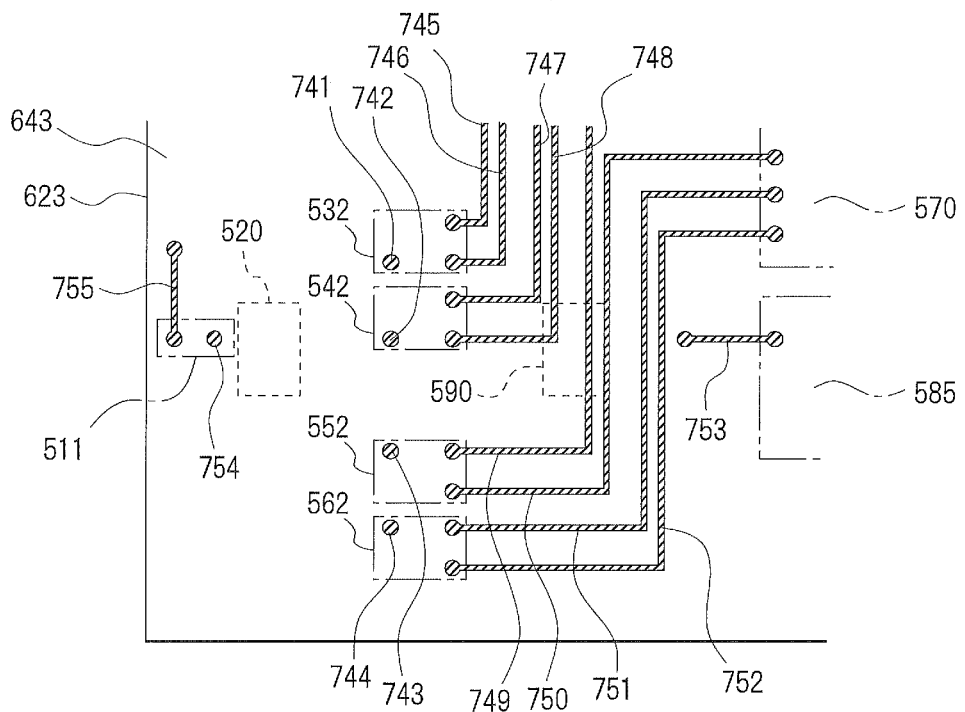
FIG. 13 shows patterns of a layer of the multilayer circuit substrate, illustrating main parts of the high frequency circuit module according to Embodiment 3.

Next, a structure for installing respective electronic components in the multilayer circuit substrate 600 will be explained. FIGS. 10 to 13, in that order, are views of the core layer 610 and the conductive layers 641 to 643 of the multilayer circuit substrate 600 from the part mounting surface side (the top of the paper of FIG. 9) of the multilayer circuit substrate 600. In FIGS. 10 to 13, the locations of the respective electronic components embedded in the multilayer circuit substrate 600 are shown by dotted lines. In FIGS. 12 and 13 the locations of the electronic components mounted on the surface layer of the multilayer circuit substrate 600 are shown by dashed lines.

Figure 10:
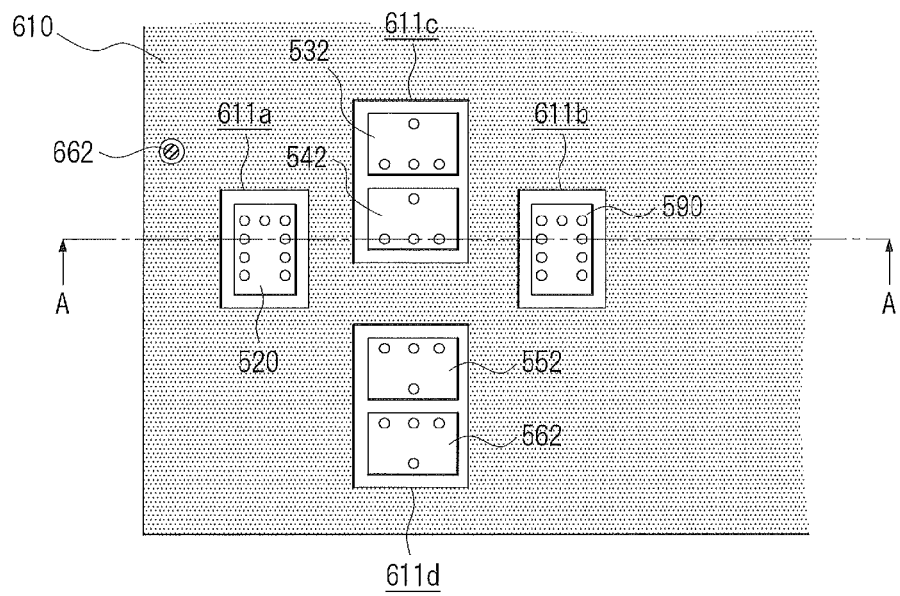
FIG. 10 shows patterns of a layer of a multilayer circuit substrate, illustrating main parts of the high frequency circuit module according to Embodiment 3.

As shown in FIG. 10, the first and third high frequency switches 520 and 590 and the first to fourth transmission filters 532, 542, 552, and 562 are placed in the penetrating holes 611 formed in the core layer 610 of the multilayer circuit substrate 600. The first and third high frequency switches 520 and 590 are individually placed in penetrating holes 611a and 611b, respectively. The first and second transmission filters 532 and 542 are placed in a common penetrating hole 611c. In a similar manner, the third and fourth transmission filters 552 and 562 are placed in a common penetrating hole 611d. The respective terminals of the first and third high frequency switches 520 and 590 and the first to fourth transmission filters 532, 542, 552, and 562 are formed on the main surface of the multilayer circuit substrate 600 opposing the part mounting surface. The through-hole 662 that is connected from the matching circuit 510 to the antenna terminal electrode 661 is formed in the core layer 610.

Figure 11:
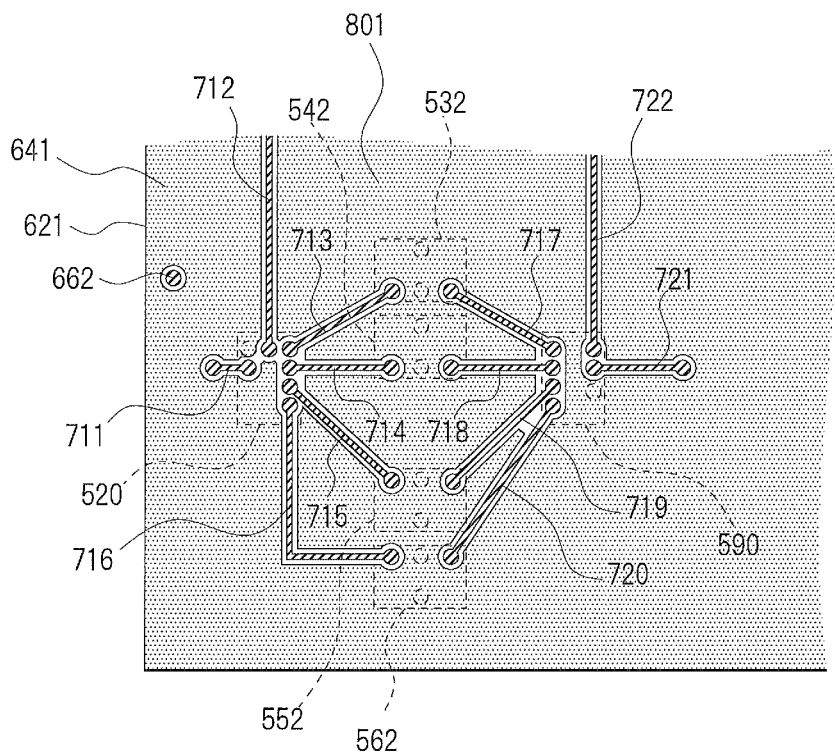
FIG. 11 shows patterns of a layer of the multilayer circuit substrate, illustrating main parts of the high frequency circuit module according to Embodiment 3.

As shown in FIG. 11, circuit patterns forming signal lines that connect with the respective electronic components through corresponding via-conductors are formed in the first conductive layer 641. Specifically, formed in the first conductive layer 641 are: a circuit pattern 711 that connects with the antenna terminals, which are input/output terminals of the first high frequency switch 520; a circuit pattern 712 that connects with a power source terminal of the first high frequency switch 520; and circuit patterns 713 to 716 that connect with the circuit terminals, which are input/output terminals of the first high frequency switch 520, and that connect with output terminals of the first to fourth transmission filters 532, 542, 552, and 562. Circuit patterns 717 to 720 that connect with input terminals of the first to fourth transmission filters 532, 542, 552, and 562 and the selection terminal of the third high frequency switch 590 are formed in the first conductive layer 641. A circuit pattern 721 for connecting the common terminal of the third high frequency switch 590 to the power amplifier IC 585, a circuit pattern 722 that connects with the power source terminal of the third high frequency switch 590, and the through-hole 662 are formed in the first conductive layer 641. Furthermore, a so-called "ground plane" ground conductor 801 is wholly formed in the first conductive layer 641 at prescribed distances from the pattern circuits 711 to 722 and the through-hole 662. This ground conductor 801 connects with the core layer 610 through the via-conductors, and connects with ground terminals of the first and third high frequency switches 520 and 590, and ground terminals of the first to fourth transmission filters 532, 542, 552, and 562 through the via-conductors. For simplicity of explanation, details have been omitted about circuit patterns that connect with control terminals of the first and third high frequency switches 520 and 590 in the present embodiment.

As shown in FIG. 12, formed in a second conductive layer 642 are: lands 731 to 734 that connect with corresponding ends of the circuit patterns 713 to 716 formed in the first conductive layer 641 through via-conductors; a land 735 that connects with an end of the circuit pattern 722 formed in the first conductive layer 641 through a via-conductor; a land 736 that connects with an end of the circuit pattern 711 formed in the first conductive layer 641 through a via-conductor; and the through-hole 662. Furthermore, a so-called "ground plane" ground conductor 802 is wholly formed in the second conductive layer 642 at prescribed distances from the lands 731 to 736 and the through-hole 662. This ground conductor 802 is connected with the ground conductor 801 of the first conductive layer 641 through the via-conductors. A first point that should be noted is that the ground conductor 802 is formed in the areas facing the respective embedded electronic parts, except for the formation areas of the necessary circuit patterns and lands. This makes the shielding characteristic of the respective embedded electronic components high. A second point to note is that the ground conductor 802 is formed at least in the regions facing the respective circuit patterns 711 and 713 to 721 formed in the first conductive layer 641. This causes return current of the current flowing through the circuit patterns 711 and 713 to 721 to pass through locations facing the respective circuit patterns 711 and 713 to 721 in the ground conductor 802. This minimizes the current loop, so waveform disturbance and radiation noise can be greatly suppressed.

As shown in FIG. 13, formed in a third conductive layer 643, i.e., the surface layer of the multilayer circuit substrate 600, are: lands 741 to 744 that connect with the lands 731 to 734 of the second conductive layer 642 through via-conductors and that connect with unbalanced input/output terminals of the first to fourth reception filters 534, 544, 554, and 564; circuit patterns 745 to 752 that connect with balanced output terminals of the first to fourth reception filters 534, 544, 554, and 564 and to the reception port of the RFIC 570; and a circuit pattern 753 that connects with the land 735 of the second conductive layer 642 through a via-conductor and that connects to the output terminal of the power amplifier IC 585. A land 754 that connects to the land 736 formed in the second conductive layer 642 via the via-conductor and that connects with one terminal of the electronic component 511 forming the matching circuit 510, and a circuit pattern 755 that connects with the other terminal of the electronic component 511 and the through-hole 662, are formed in the third conductive layer 643. The distance between the circuit pattern 746 closer to the adjacent second reception filter 544, and the circuit pattern 747 closer to the first reception filter 534 among a pair of circuit patterns 747 and 748 extending from the balanced output terminals of the second transmission filter 542, is wider than the distance between the pair of circuit patterns 745 and 746 extending from the balanced output terminals of the first reception filter 542, and wider than the distance between the pair of circuit patterns 747 and 748 extending from the balanced output terminals of the second reception filter 544. This is to reduce signal interference between the frequency bands. This is similar for other reception filters.

As shown in FIG. 9, a so-called "ground plane" ground conductor 811 is formed in the conductive layer 651, which faces the respective embedded electronic components and is formed on the side opposite to the conductive layer 641. This ground conductor 811 is connected to the core layer 610 through via-conductors. A point to note is that this ground conductor 811 is formed in the areas facing the respective embedded electronic components, except for the formation areas of the necessary circuit patterns and lands. In this way, the respective embedded electronic components are surrounded by the ground conductor 801 formed in the conductive layer 641, the conductive core layer 610, and the ground conductor 811 formed in the conductive layer 651. Accordingly, the respective embedded electronic components have high shielding characteristics.

In the high frequency circuit module 500 of the present embodiment, the first and third high frequency switches 520 and 590 and the first to fourth transmission filters 532, 542, 552 and 562 are embedded in the multilayer circuit substrate 600, and thus it is possible to achieve the size reduction. The respective embedded electronic components are sandwiched by the ground conductors 802 and 811, so the shielding effect of the electronic parts is high, with excellent high-frequency characteristics. The respective electronic components are placed in the penetrating holes 611 formed in the conductive core layer 610, or in other words are surrounded by the conductors, so a high shielding effect can be achieved. In the present embodiment, the circuit patterns 713 to 716 that are signal lines connecting the first high frequency switch 520 and the first to fourth transmission filters 532, 542, 552, and 562, and the circuit patterns 717 to 720 that are signal lines connecting the first to fourth transmission filters 532, 542, 552, and 562 and the third high frequency switch 590, are formed in the multilayer circuit substrate 600. The ground conductor 802 is formed in the areas facing the circuit patterns 713 to 720, and thus the current flowing to the circuit patterns 713 to 720 and the current loop formed by the return current thereof can be suppressed to a minimum. This makes it possible to reduce the waveform disturbance and radiation noise.

In the high frequency circuit module 500 of the present embodiment, the ground conductor 802 is present between the circuit patterns 745 to 752 formed in the surface layer of the multilayer circuit substrate 600 and the circuit patterns 713 to 720 formed in the first conductive layer 641. Thus, signal interference can be prevented.

The high frequency circuit module 500 of the present embodiment can amplify the transmission signals for the plurality of frequency bands by the common high frequency amplifier 580, thus enabling the reduction in size.

In the high frequency circuit module 500 of the present embodiment, the matching circuit 510 is mounted on the multilayer circuit substrate 600, so a desired characteristic can be obtained with ease by switching, adjusting, etc. the matching circuit. The distance between the matching circuits and the embedded electronic components can also be made short, so loss of high frequency signals can be suppressed.

The high frequency circuit module of the present embodiment was illustrated as a modification example of the high frequency circuit module of Embodiment 1, but similar changes can be applied to the high frequency circuit module of Embodiment 2.

Embodiment 4

A high frequency circuit module according to Embodiment 4 of the present invention will be explained with reference to figures. The high frequency circuit module of the present embodiment differs from Embodiment 1 in regards to the layered structure of the multilayer circuit substrate. Other features are similar to Embodiment 1, and thus only the differences will be explained. Configurations that are similar to Embodiment 1 are given the same reference characters.

Figure 14:
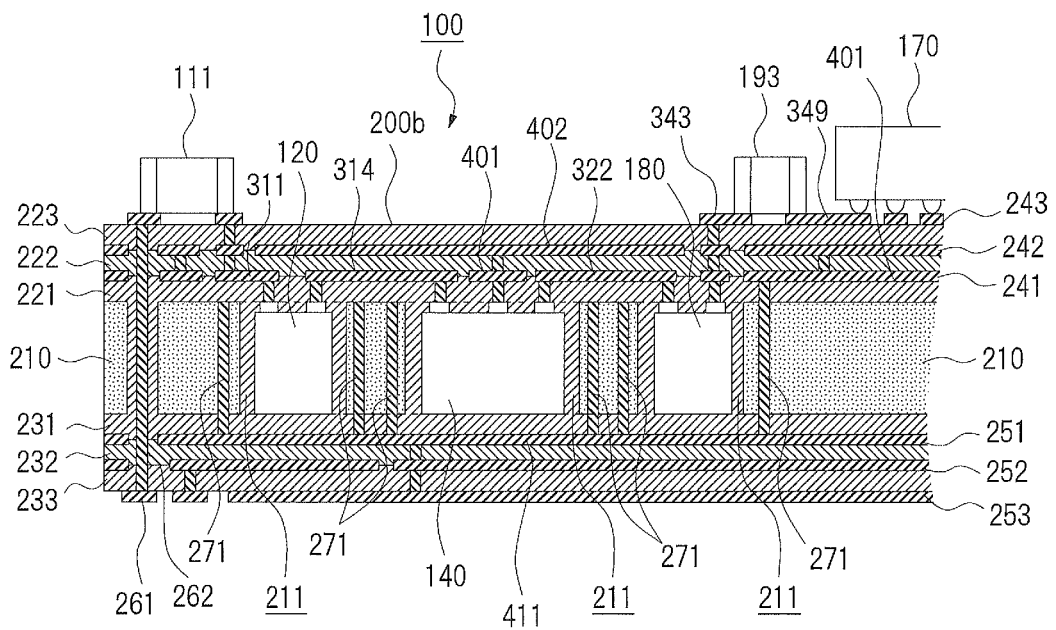
FIG. 14 is a cross-sectional view of a high frequency circuit module according to Embodiment 4.
Figure 15:
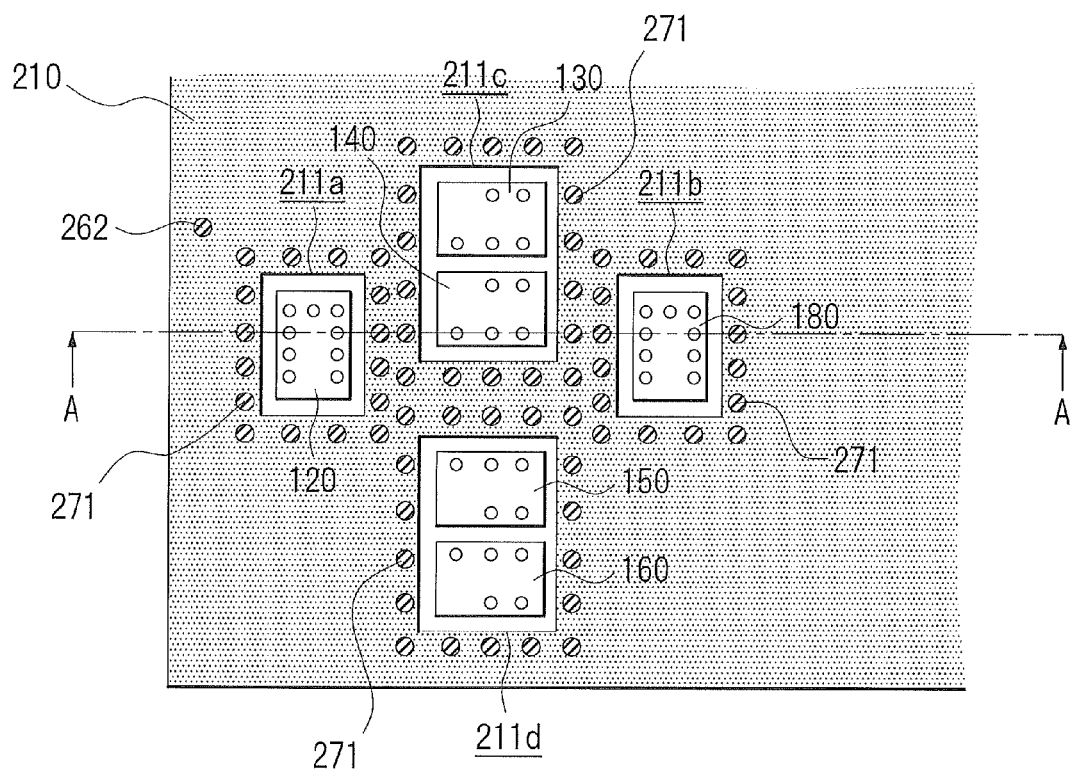
FIG. 15 is a top view of a core layer illustrating main parts of the high frequency circuit module according to Embodiment 4.

FIG. 14 is a cross-sectional view of the high frequency circuit module of Embodiment 4, and FIG. 15 is a top view of a core layer in the high frequency circuit module of Embodiment 4. A multilayer circuit substrate 200 of Embodiment 1 used a conductive material for the core layer 210. However, the multilayer circuit substrate 200b of the present embodiment uses an insulating material as the core layer 210. Specifically, examples of the core layer 210 include insulating resins such as epoxy and polyimide, and glass epoxy in which glass fiber or the like has been treated with an epoxy resin. The insulating material is not limited to these, as long as the material is an insulating material for a circuit substrate. Due to these differences, the multilayer circuit substrate 200b of the present embodiment does not have via-conductors that connect ground conductors 401 and 411 and the core layer 210.

As shown in FIGS. 14 and 15, the multilayer circuit substrate 200b of the present embodiment, a large number of via-conductors 271 are formed around penetrating holes 211 formed in the core layer 210. These via-conductors 271 are connected with the ground conductor 411 and the ground conductor 401. In other words, respective sides of the electronic components placed inside the penetrating holes 211 are surrounded by the ground conductors 401 and 411 and the via-conductors 271. Accordingly, the respective embedded electronic components have high shielding characteristics.

The high frequency circuit module of the present embodiment was illustrated as a modification example of the high frequency circuit module of Embodiment 1, but the same changes can be applied to the high frequency circuit module of Embodiment 2 or Embodiment 3. If applied to Embodiment 2, the via-conductors 271 may connect with the ground conductor 421 and the ground conductor 411.

The embodiments of the present invention were described above, but the present invention is not limited thereto. In each embodiment described above, each part mounted on the top of the circuit substrate 200 or 600 is exposed, but a case may be affixed or a resin or the like may be used so as to cover all or part of the top of the circuit substrate 200 or 600, for example.

The frequency bands described in each embodiment are merely examples, and the present invention is applicable even with other frequency bands. In the embodiments described above, duplexers were included as examples of branching filters (antenna duplexers), but the present invention is applicable even with a branching filter that has three or more pass frequency bands such as a triplexer.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A high frequency circuit module, comprising:
   a multilayer circuit substrate formed by alternately stacked insulating layers and conductive layers;
   a transmission filter that performs filtering on high frequency transmission signals;
   a reception filter that performs filtering on high frequency reception signals; and
   a first high frequency switch that switches connections of an antenna and the transmission and reception filters,
   wherein either one or both of the transmission filter and reception filter, and the first high frequency switch, are embedded within and inside of the multilayer circuit substrate under an uppermost insulating layer of the multilayer circuit substrate,
   wherein a first ground conductor is formed in a first conductive layer located above the first high frequency switch and each embedded filter in the multilayer circuit substrate, the first ground conductor being formed in regions facing at least the first high frequency switch and each embedded filter,
   wherein a second ground conductor is formed in a second conductive layer located below the first high frequency switch and each embedded filter in the multilayer circuit substrate, the second ground conductor being formed in regions facing at least the first high frequency switch and each embedded filter,
   wherein a first matching circuit between the antenna and first high frequency switch is mounted on a top surface of the multilayer circuit substrate, and terminal electrodes of the high frequency circuit module are formed on a bottom surface that is opposite to the top surface, and
   wherein input/output terminals of the first high frequency switch are formed on the top surface of the multilayer circuit substrate.

2. The high frequency circuit module according to claim 1,
   wherein signal wires are formed in a third conductive layer adjacent to the first conductive layer through an insulating layer, the signal wires connecting with the first high frequency switch and each embedded filter, and
   wherein the first ground conductor is formed in regions facing at least the signal wires.

3. The high frequency circuit module according to claim 1,
   wherein at least the reception filter is embedded in the multilayer circuit substrate, and
   wherein the reception filter and a second matching circuit that matches with a high frequency IC are mounted on a top surface of the multilayer circuit substrate, the high frequency IC processing the reception signals, and
   wherein terminal electrodes of the high frequency circuit module are formed on a bottom surface that is opposite to the top surface, and
   wherein input/output terminals of the embedded reception filter are formed on the top surface of the multilayer circuit substrate.

4. The high frequency circuit module according to claim 1, further comprising:
   a high frequency IC that processes the reception signals filtered by each reception filter of a plurality of reception filters, the reception filters having mutually different frequency bands and being embedded in at least the multilayer circuit substrate; and
   a second high frequency switch that switches the reception filters connected to a common reception terminal of the high frequency IC,
   wherein the second high frequency switch is embedded in the multilayer circuit substrate and formed in a location in which signal wires that connect the second high frequency switch and the reception filters face the first ground conductor in the multilayer circuit substrate.

5. The high frequency circuit module according to claim 1,
wherein the multilayer circuit substrate includes a core layer that has a greater thickness than the other conductive layers, and
wherein the first high frequency switch and each embedded filter are placed in penetrating holes or recessed parts formed in the core layer.

6. The high frequency circuit module according to claim 5,
wherein the core layer is made of a conductive material and is provided with a ground potential.

7. The high frequency circuit module according to claim 5,
wherein the core layer is made of an insulating material, and
wherein a plurality of via-conductors are formed around the first high frequency switch and each embedded filter, the plurality of via-conductors connecting the first ground conductor and second ground conductor.

8. The high frequency circuit module according to claim 5,
wherein a plurality of the reception filters are placed in one penetrating hole or recessed part.

9. A high frequency circuit module comprising:
a multilayer circuit substrate formed by alternately stacked insulating layers and conductive layers;
a transmission filter that performs filtering on high frequency transmission signals;
a reception filter that performs filtering on high frequency reception signals;
a first high frequency switch that switches connections of an antenna and the transmission and reception filters,
wherein either one or both of the transmission filter and reception filter, and the first high frequency switch, are embedded within and inside of the multilayer circuit substrate under an uppermost insulating layer of the multilayer circuit substrate,
wherein a first ground conductor is formed in a first conductive layer located above the first high frequency switch and each embedded filter in the multilayer circuit substrate, the first ground conductor being formed in regions facing at least the first high frequency switch and each embedded filter, and
wherein a second ground conductor is formed in a second conductive layer located below the first high frequency switch and each embedded filter in the multilayer circuit substrate, the second ground conductor being formed in regions facing at least the first high frequency switch and each embedded filter,
wherein the high frequency circuit module further comprises:
a plurality of the transmission filters having mutually different frequency bands that are embedded in at least the multilayer circuit substrate;
an amplifier that amplifies the transmission signals; and
a third high frequency switch that switches the transmission filters connecting to output terminals from the amplifier,
wherein the third high frequency switch is embedded in the multilayer circuit substrate, and
wherein signal wires that connect the third high frequency switch and the transmission filters are provided in the multilayer circuit substrate.

10. The high frequency circuit module according to claim 9,
wherein the reception filters for the frequency bands corresponding to the embedded transmission filters are mounted on the top surface of the multilayer circuit substrate, and
wherein part or all of a region of the reception filters projected in a thickness direction of the multilayer circuit substrate overlaps the transmission filters.

11. The high frequency circuit module according to claim 9,
wherein the reception filters for the frequency bands corresponding to the embedded transmission filters, and a high frequency IC that processes the reception signals are mounted on the top surface of the multilayer circuit substrate, and
wherein signal wires that connect the high frequency IC and reception filters are mounted on the top surface of the multilayer circuit substrate.

12. The high frequency circuit module according to claim 10,
wherein a ground conductor is formed in a conductive layer between signal wires that transmit the transmission signals and signal wires that transmit the reception signals.

* * * * *